United States Patent
Huang et al.

(10) Patent No.: US 7,368,520 B2
(45) Date of Patent: *May 6, 2008

(54) CROSSLINKED COMPOSITIONS COMPRISING A POLY(ARYLENE ETHER) AND A NONLINEAR OPTICAL CHROMOPHORE, AND DEVICES INCORPORATING SAME

(75) Inventors: Diyun Huang, Bothell, WA (US); Timothy M. Londergan, Seattle, WA (US)

(73) Assignee: Lumera Corporation, Bothell, WA (US)

( * ) Notice: Subject to any disclaimer, the term of this patent is extended or adjusted under 35 U.S.C. 154(b) by 30 days.

This patent is subject to a terminal disclaimer.

(21) Appl. No.: 11/424,946

(22) Filed: Jun. 19, 2006

(65) Prior Publication Data
US 2007/0032628 A1 Feb. 8, 2007

Related U.S. Application Data

(62) Division of application No. 10/714,387, filed on Nov. 14, 2003, now Pat. No. 7,101,957.

(51) Int. Cl.
*C08G 61/00* (2006.01)
*C08G 61/12* (2006.01)
*C08G 65/00* (2006.01)

(52) U.S. Cl. .................. 528/86; 528/104; 528/205; 528/219; 528/503; 525/63; 525/64; 525/328.9; 525/330.9; 525/534

(58) Field of Classification Search .................. 528/86, 528/104, 25, 219, 503; 525/63, 64, 328.9, 525/330.9, 534; 428/690, 917; 252/301.16, 252/301.35
See application file for complete search history.

(56) References Cited

U.S. PATENT DOCUMENTS

| | | | |
|---|---|---|---|
| 7,001,678 B2 * | 2/2006 | Casasanta et al. | 428/690 |
| 7,008,556 B2 * | 3/2006 | Casasanta et al. | 252/301.16 |
| 7,067,593 B2 * | 6/2006 | Londergan | 525/328.9 |
| 7,101,957 B2 * | 9/2006 | Huang et al. | 528/86 |

* cited by examiner

*Primary Examiner*—Duc Truong
(74) *Attorney, Agent, or Firm*—Fish & Richardson P.C.

(57) ABSTRACT

Crosslinked polymer blends comprising a poly(arylene ether) and a nonlinear optical chromophore. Also featured are electro-optic devices incorporating these blends.

10 Claims, 8 Drawing Sheets

1

2

3

| base (I)

16

17

18

CROSSLINKED COMPOSITIONS COMPRISING A POLY(ARYLENE ETHER) AND A NONLINEAR OPTICAL CHROMOPHORE, AND DEVICES INCORPORATING SAME

This application is a divisional (and claims the benefit of priority under 35 U.S.C § 120) of U.S. application Ser. No. 10/714,387, filed Nov. 14, 2003 now U.S. Pat. No. 7,101,957. The disclosure of the prior application is considered part of (and is incorporated by reference in) the disclosure of this application.

STATEMENT OF RELATED CASES

This application is also related to the following, concurrently filed, commonly assigned U.S. patent applications, each of which is incorporated by reference: (1) U.S. Ser. No. 10/713,469 entitled "Poly(arylene ethers) with Pendant Crosslinkable Groups, and Devices Incorporating Same now U.S. Pat. No. 7,067,593;" (2) U.S. Ser. No. 10/714,356 entitled "Process for Preparing Poly(arylene ethers) with Pendant Crosslinkable Groups now U.S. Pat. No. 7,038,004;" (3) U.S. Ser. No. 10/714,266 entitled "Process for Preparing Crosslinked Polymer Blends That Include a Luminescent Polymer now U.S. Pat. No. 7,008,556;" and (4) U.S. Ser. No. 10/714,837 entitled "Crosslinked Polymer Blends That Include a Luminescent Polymer, and Devices Incorporating Same now U.S. Pat. No. 7,001,678."

BACKGROUND

All patents, patent applications, and publications cited within this application are incorporated herein by reference to the same extent as if each individual patent, patent application or publication was specifically and individually incorporated by reference.

The invention relates generally to crosslinkable polymer compositions, methods of making crosslinkable polymers, and devices and uses for crosslinkable polymers. Crosslinked polymer compositions generally have higher glass transition temperatures ($T_g$) and greater mechanical stability than noncrosslinked polymers. In addition, crosslinked polymers are usually resistant to solvents that dissolve noncrosslinked polymers. The property of solvent resistance is particularly important in applications that require overcoating of polymers with other polymers. The properties of crosslinked polymers including high mechanical strength, high $T_g$, and solvent resistance are important in applications such as protective coatings, electronics, optics, electro-optics, and polymer light emitting diodes.

Poly(arylene ether)s having hydroxy, cyclopentadienone, acrylate, and alkynyl crosslinkable groups in the main chain and/or side-chain (pendant) are known, for example see U.S. Pat. Nos. 6,340,528; 6,313,185; 6,117,967; 6,060,170; 5,994,425; 5,849,809; 5,498,803; and 5,204,416. In some cases, functional groups have been grafted onto poly(arylene ether)s under conditions requiring long reaction times. In other cases, functional groups on the poly(arylene ether) backbone were converted into other functional groups under reaction conditions such as reduction or lithiation/carbonyl addition, which may limit the possible monomers or pendant groups to structures that are not reactive under those conditions.

SUMMARY

One embodiment is a polymer comprising units having the formula (I)

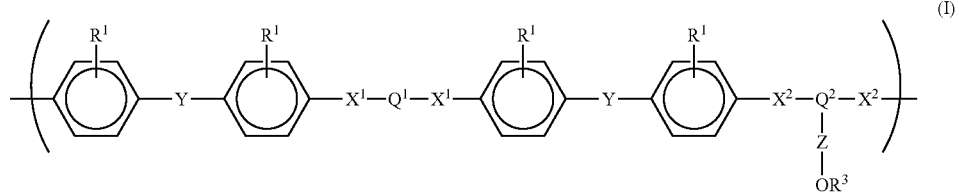

wherein: $Q^1$ comprises at least one aryl or heteroaryl group; $Q^2$ comprises at least one aryl or heteroaryl group; $X^1$ is O bonded directly to an aryl carbon of $Q^1$; $X^2$ is O bonded directly to an aryl carbon of $Q^2$; Z is a linker comprising at least one —$(C(R^2)_2)$— group; Y is a single bond or linker group (e.g., comprising up to about 50 carbons); $R^1$ is independently at each occurrence H, a halogen, an alkyl group, a heteroalkyl group, an aryl group, or a heteroaryl group; $R^2$ is independently at each occurrence H, an alkyl group, or a heteroalkyl group; and $R^3$ is H or a crosslinkable group. The crosslinkable group may be chosen from any crosslinkable groups that are activated chemically, thermally, or photochemically.

Another embodiment is a process comprising: a) reacting a diphenol monomer A with a monomer B having two locations for reaction with A to form arylene ether monomer C and b) reacting arylene ether monomer C with a diphenol monomer D to form a polymer, where monomer A is

monomer B is

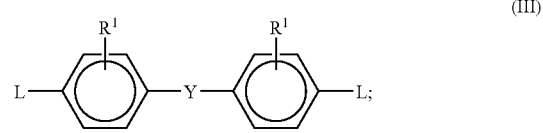

arylene ether monomer C is

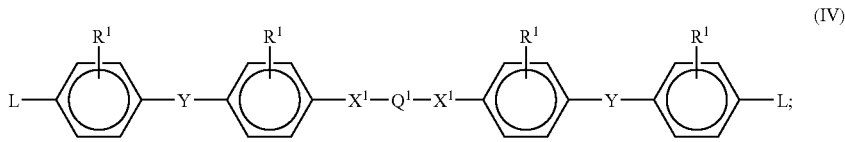
(IV)

and monomer D is

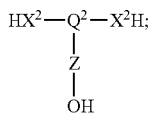
(V)

wherein $Q^1$, $Q^2$, $X^1$, $X^2$, $Z$, $Y$, $R^1$, and $R^2$ are as described above and L is a leaving group. The process provides polymers of structure (I) that are highly regular and free of blockiness.

Another embodiment is a composition made by a process comprising a) providing a precursor composition comprising a polymer of structure (I)

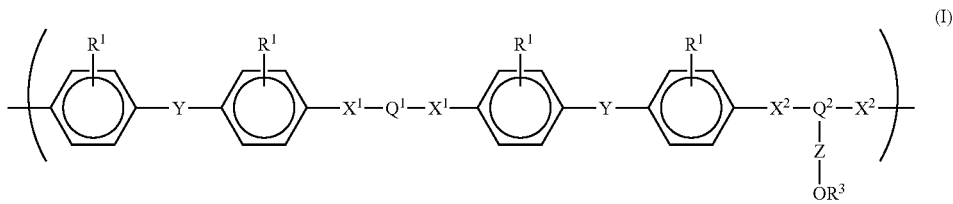
(I)

and b) crosslinking the polymer, wherein $Q^1$, $Q^2$, $X^1$, $X^2$, $Z$, $Y$, $R^1$, $R^2$, and $R^3$ are as described above. Crosslinking may be accomplished by reaction of an $R^3$ crosslinking group with another $R^3$ crosslinking group or with additives that react with the $R^3$ groups. Other embodiments are optical devices comprising these compositions.

Another embodiment is a composition made by a process comprising a) providing a precursor composition comprising a nonlinear optical chromophore having the structure D-π-A and polymer of structure (I)

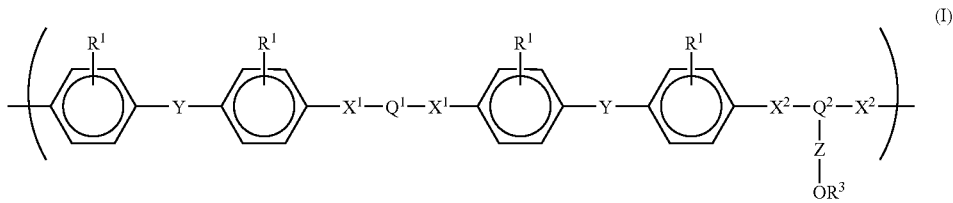
(I)

and b) crosslinking the polymer, wherein: D is a donor, π is a p-bridge, A is an acceptor, and $Q^1$, $Q^2$, $X^1$, $X^2$, $Z$, $Y$, $R^1$, $R^2$, and are as described above. Preferably, the process further comprises applying an electric field to effect poling. The electric field may be applied using contact poling or corona poling. The poling may begin before crosslinking, during crosslinking, or after crosslinking. Other embodiments are electro-optic devices made from the compositions.

Another embodiment is a process comprising a) providing a polymer blend comprising a luminescent polymer and a second polymer, where at least one of the polymers is crosslinkable, and b) crosslinking the crosslinkable polymer. As used herein, a "polymer blend" is a macroscopically homogeneous mixture of two or more different species of polymer, as recited in Jenkins, A. D. et al., IUPAC Glossary of Basic Terms in Polymer Science, *Pure Appl. Chem.* 1996, 68(12), 2287-2311. In some embodiments, both polymers are crosslinkable. Other embodiments are polymer blends comprising a luminescent polymer and a second polymer, where at least one of the polymers is crosslinked. Additional embodiments include light emitting devices comprising the crosslinked compositions.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
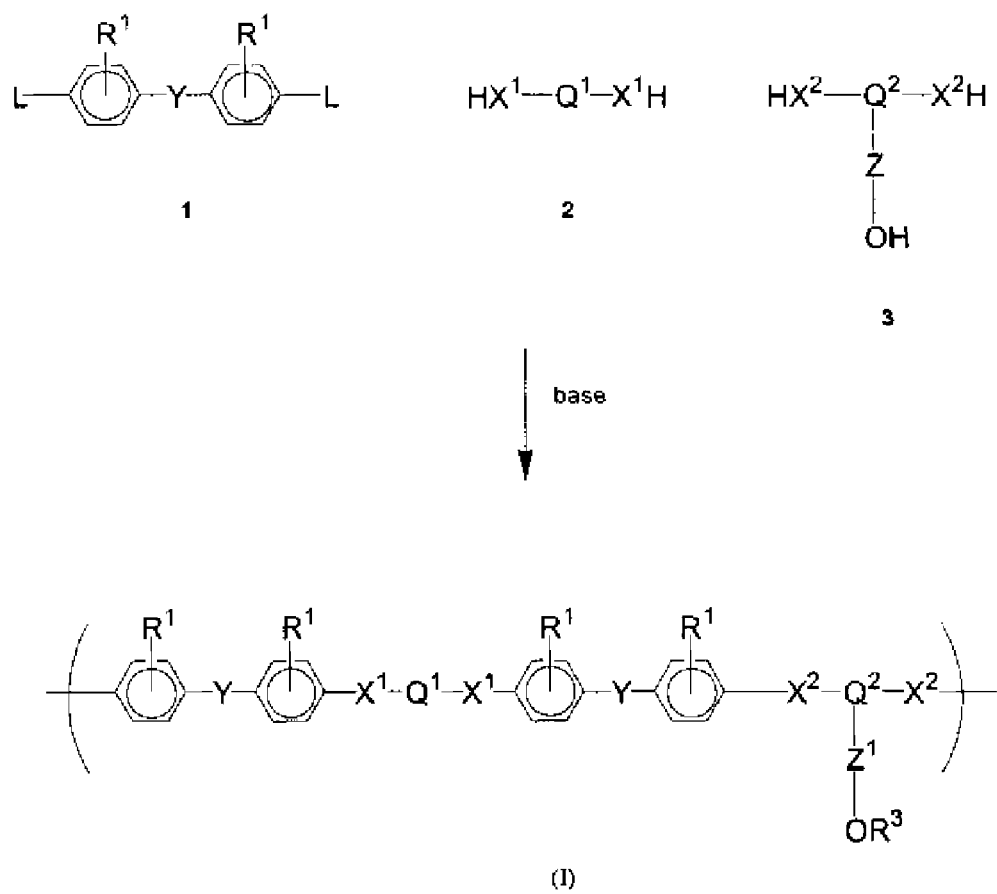
FIG. 1 illustrates a general scheme for preparing poly (arylene ether)s.

In one embodiment, a poly(arylene ether) polymer comprises units having the formula (I)

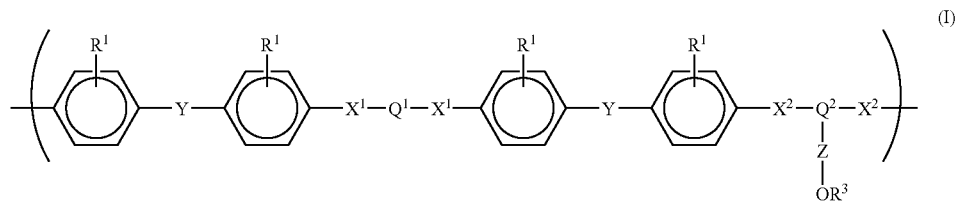

wherein: $Q^1$ comprises at least one aryl or heteroaryl group; $Q^2$ comprises at least one aryl or heteroaryl group; $X^1$ is O bonded directly to an aryl carbon of $Q^1$; $X^2$ is O bonded directly to an aryl carbon of $Q^2$; Z is a linker comprising at least one —(C($R^2$)$_2$)— group; Y is a single bond or linker group (e.g., comprising up to about 50 carbons); $R^1$ is independently at each occurrence H, a halogen, an alkyl group, a heteroalkyl group, an aryl group, or a heteroaryl group; $R^2$ is independently at each occurrence H, an alkyl group, or a heteroalkyl group; and $R^3$ is H or a crosslinkable group. In some embodiments, $Q^1$ comprises a polycyclic aromatic ring system or a polycyclic heteroaromatic ring system. In many embodiments, $Q^1$ comprises at least two aryl or heteroaryl groups. Preferably, the linker between the first aryl or heteroaryl group and the second aryl or heteroaryl group is a methylenediphenyl group in which the methylene carbon is bonded to at least two phenyl groups. Typically, the methylenediphenyl group originates from a bisphenol monomer. Bisphenols are compounds made by condensing one equivalent of an aldehyde or ketone with two equivalents of a phenol. Consequently, both the phenyl and methylene moiety of the methylenediphenyl group can be substituted with a variety of heteroatoms, alkyl groups, heteroalkyl groups, aryl groups, or heteroaryl groups. When structurally feasible, the substituents on the methylene group of the methylenediphenyl group can be bonded to each other to form one or more rings. The diphenyl groups of the methylene diphenyl group may also be joined together to form a ring. Some examples of methylenediphenyl groups are

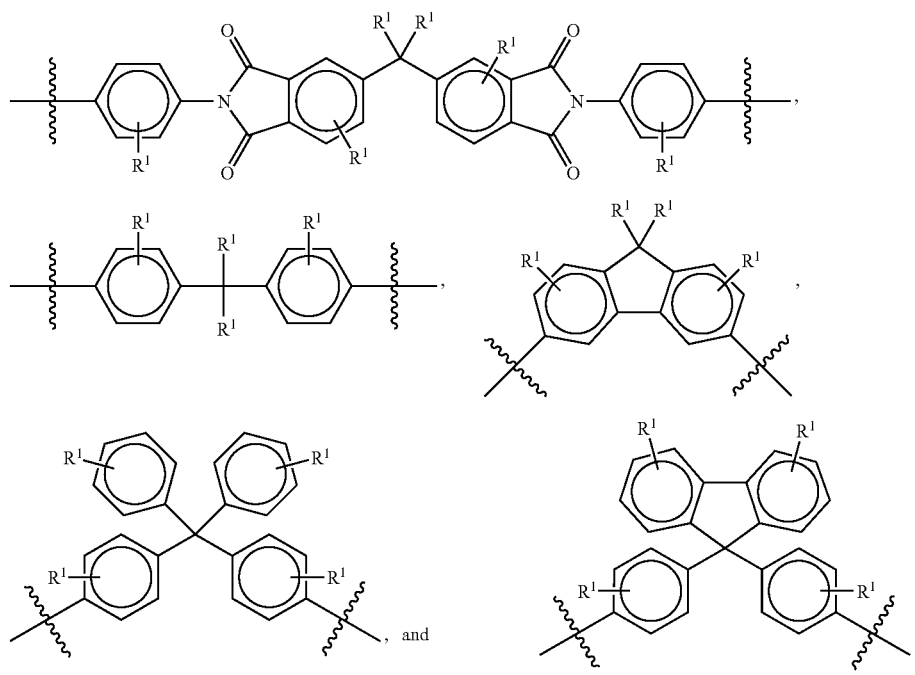

Referring to structure (I), Y is a single bond or a linker group. The linker group can be any chemical group that can withstand the polymerization conditions and allows the monomer to undergo nucleophilic, phenolic aromatic substitutions on the phenyl rings bonded to Y. Preferably, Y is a single bond and $R^1$ is F at each position on the phenyl rings bonded to Y. In some embodiments, Y comprises a single bond, an alkene or an alkyne group. In other embodiments, Y comprises a ketone, a sulfone, or a phosphine oxide group. The ketone, sulfone, or phosphine oxide group may be part of a linear chemical group or part of a ring that is conjugated to the phenyl rings bonded to Y. Preferably, the ketone, sulfone, or phosphine oxide group is bonded directly to the phenyl rings bonded to Y, i.e., Y is preferably

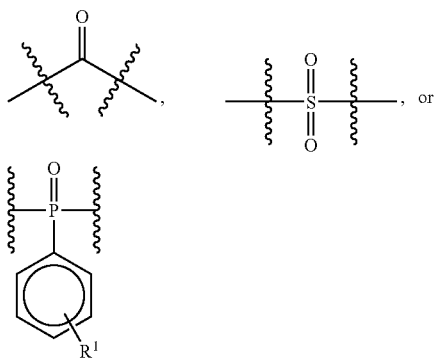

Referring again to structure (I), $Q^2$ may be a 6-membered aromatic or heteroaromatic ring, a polycyclic aromatic ring system, or a polycyclic heteroaromatic ring system provided that the ring or ring system is capable of forming a bond with both $X^2$ atoms and the Z linker group. Preferably, $Q^2$ comprises a phenyl ring to which both $X^2$ oxygen atoms are bonded, i.e. $Q^2$ comprises

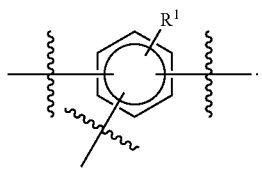

When $Q^2$ comprises a phenyl ring to which both $X^2$ oxygen atoms are bonded, the oxygen atoms may be substituted para, meta, or ortho to each other. The linker group Z may be bonded to any atom in the ring and may further comprise heteroatoms, heteroalkyl groups, aryl groups, or heteroaryl groups. In many embodiments, linker group Z is —$(CH_2)_n$— or —$(OCH_2CH_2)_n$— having n=1 to 10.

In some embodiments, $R^3$ is a crosslinkable group. In general, crosslinkable groups comprise functional groups that react to form bonds under certain conditions. The crosslinkable group may react with crosslinkable groups on another polymer chain or with additives (e.g., diepoxides, diisocyantes, diisothiocyantes, and the like). The crosslinkable group may be chosen from any crosslinkable groups that are activated chemically, thermally, or photochemically. Photochemical activation may be through either a photoradical or photoacid. An alcohol of the polymer (e.g., $R^3$=H) may serve as a crosslinking group. The crosslinkable group may be attached to the monomer before polymerization, provided that no undesirable reaction occurs with the crosslinker during polymerization. The crosslinker may also be grafted onto polymer by any reaction between a functional group on the polymer and the crosslinker. Examples of such reactions are nucleophilic substitution or addition, etherification, or esterification with an alcohol on the polymer (e.g., $R^3$=H). For example, the crosslinkable group may be functionalized with a carboxylic acid that may be grafted onto the polymer using a chemical reagent that converts the acid into an acylating agent in situ. Examples of such reagents are dicyclohexylcarbodiimide/dimethylaminopyridine (DCC/DMAP), a 2-chloropyridinium ion, and the like (see Carey and Sundberg *Advanced Organic Chemistry Part B: Reactions and Synthesis*, Third Edition, Plenum Press, New York, p 145-151 and others). Alternatively, the crosslinkable group may be functionalized with a carboxylic acid chloride, which can react with the alcohol polymer with the assistance of a base such as pyridine. Crosslinkable groups functionalized with a phenol may be grafted onto the polymer by the Mitsonobu reaction. Functional groups on the polymer may also be converted into other functional groups that can function as a site for grafting crosslinkers onto the polymer. The resulting functional groups may also be used as crosslinkable groups themselves. One such example is conversion of an alcohol on the polymer (e.g., when $R^3$=H) to an ester/acid by reaction with a cyclic anhydride such as succinic anhydride, phthalic anhydride, and the like. The carboxylic acid can be used to attach crosslinkers or can be used as a crosslinker itself by using additives such as diepoxides and the like, For examples, see U.S. Pat. Nos. 5,776,378; 4,859,758; and 4,539,340. Preferably, the crosslinkable group is one that can be crosslinked by methods known in the art, such as: a) by photoradical generators such as 1-hydroxycyclohexylphenyl ketone, acetophenon dimethylketal or benzoylmethyl ether and the like; b) by direct UV dimerization such as coumarins (U.S. Pat. No. 6,423,818 B1) or cinnamates (U.S. Pat. No. 5,484,821); and c) by thermal reactions such as with aryl trifluorovinyl ethers and benzocyclobutenes. Examples of such crosslinkable groups are

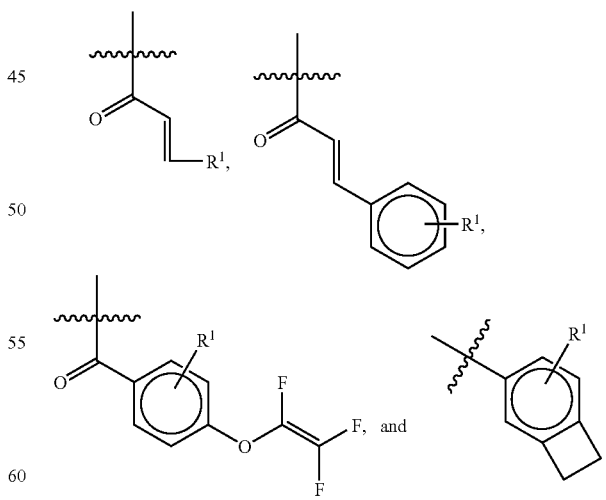

In one embodiment, $Q^1$ comprises a methylenediphenyl group in which the methylene carbon is bonded to at least two phenyl groups; $Q^2$ comprises a phenyl ring to which both $X^2$ oxygen atoms are bonded; Y is a single bond; and Z is —$CH_2$—. In this embodiment, $R^1$ at each occurrence on the phenyl ring bonded to Y is preferably fluorine. In another preferred embodiment, $R^3$ comprises an aryl trifluorovinyl ether. In another embodiment, the methylene of $Q^1$ is substituted with at least three phenyl groups.

Figure 2:
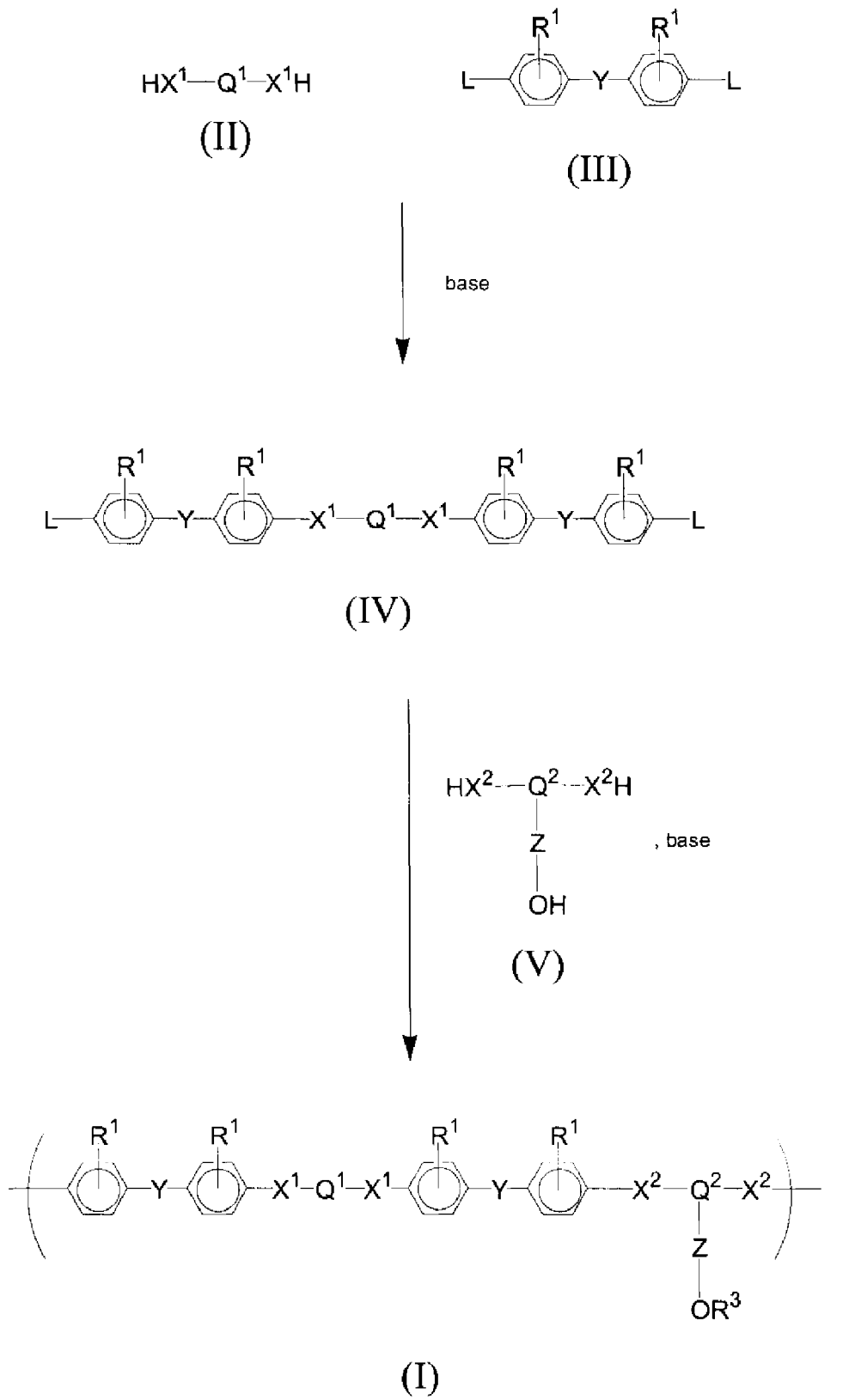
FIG. 2 illustrates a process for preparing functionalized arylene ethers.

In general, referring to FIG. 1, polymers comprising units having formula (I) can be prepared by reacting about 1 equivalent of a compound 1 having at least two nucleophilic aromatic leaving substituents (L) with about 0.5 equivalents of a diphenol 2 and about 0.5 equivalents of a diphenol functionalized with an aliphatic alcohol 3. A nucleophilic aromatic leaving substituent is a moiety that can act as a leaving group in an aromatic substitution reaction. A nucleophilic aromatic leaving substituent can be a single atom or a group of atoms, for example see F. A. Carey and R. J. Sundberg *Advanced Organic Chemistry, Part A*, $3^{rd}$ ed. 1990, pp 579-583. If one of the diphenol compounds 2 or 3 is more reactive, the resulting polymer may have blocks resulting from reaction of 1 with the more reactive diphenol to give an oligomer, followed by reaction with the less reactive diphenol to give a block copolymer. Some applications, such as low loss optical polymers, may favor a copolymer without blocks (i.e., a polymer that has substantially the structure in (I) throughout the polymer chain). The inventors have found that blockiness resulting from reactivity differences in the monomers can be overcome by a) reacting diphenol monomer A with monomer B to give monomer C with structure B-A-B, wherein monomer B has at least two sites for reacting with monomer A, and b) reacting diphenol monomer C with another monomer D to give a polymer. Referring to FIG. 2, monomer A is

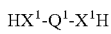 (II);

monomer B is

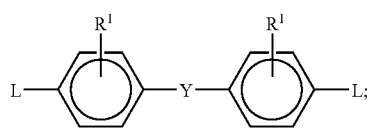 (III)

monomer C is

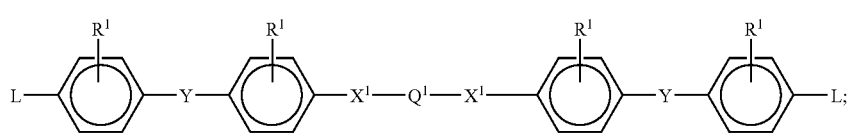 (IV)

and monomer D is

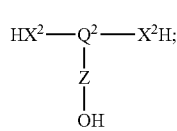 (V)

wherein $Q^1$, $Q^2$, $X^1$, $X^2$, Z, Y, $R^1$, and $R^2$ are as described above and L is a nucleophilic aromatic leaving substituent. Preferably, referring to structure (II), $Q^1$ comprises a methylenediphenyl group, e.g., (II) is a bisphenol. L may be a halogen, nitro group, or phenylsulfonyl group. Preferably, L is fluorine. In one embodiment, reacting monomer A with monomer B comprises heating a mixture of monomer A and monomer B in a dipolar aprotic solvent to at least 110° C. Dipolar aprotic solvents are known in the art and include dimethylformamide (DMF) and dimethylacetamide (DMAC). Another embodiment of the process further comprises cooling the reaction mixture of monomer A and monomer B after monomer C is formed and before monomer D is reacted with monomer C. Preferably reacting monomer C with monomer D to form a polymer comprises heating a mixture of monomer C and monomer D in a dipolar aprotic solvent to at least 110° C., thereby providing a polymer solution. In one useful embodiment, the process further comprises filtering the polymer solution while the temperature of the polymer solution is greater than about 80° C. Such filtering removes most of the inorganic salts while ensuring the solubility of the polymer in the filtrate. In another embodiment, monomer A is

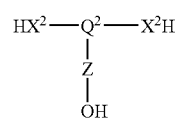 (V)

monomer B is

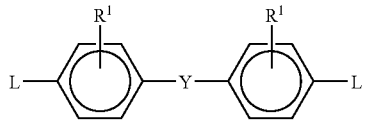 (III)

monomer C is

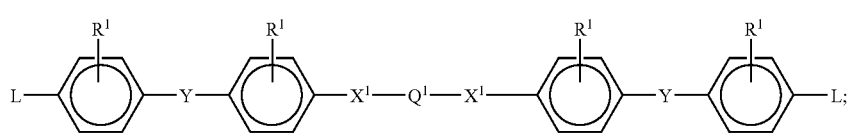 (IV)

and monomer D is

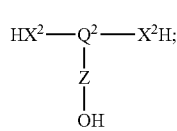 (V)

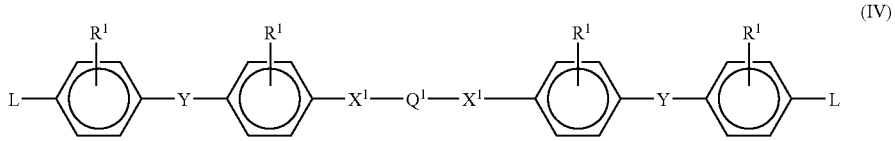

and monomer D is

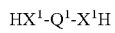 (II)

wherein $Q^1$, $Q^2$, $X^1$, $X^2$, Z, Y, L, $R^1$, and $R^2$ are as described above.

The compositions made from the crosslinkable polyarylene ethers described above may be useful in variety of applications including low k dielectrics and passive optical components. Another embodiment is a composition made by a process comprising a) providing precursor composition comprising a polymer having units with the formula (I)

U.S. Pat. No. 6,306,563. A typical optical waveguide comprises clad layers surrounding a waveguiding core. The refractive index of the clad layers is lower than the refractive index of the core. The crosslinked compositions described above have low optical loss and are useful for fabricating waveguide optical devices with enhanced performance. Another embodiment is a device including a waveguide comprising the crosslinked compositions described above.

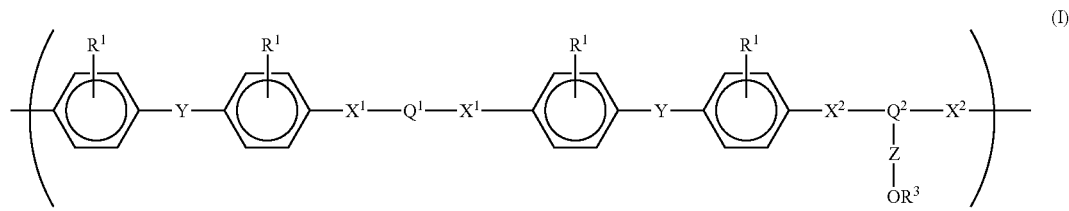

and b) crosslinking the polymer, wherein $Q^1$, $Q^2$, $X^1$, $X^2$, Z, Y, $R^1$, $R^2$, and $R^3$ are as described above. The precursor composition may be provided by known methods including spin coating, dip coating, brushing, printing (e.g., ink jet printing), and the like. Crosslinking may be accomplished by reaction of an $R^3$ crosslinking group with another $R^3$ crosslinking group or with additives that react with the $R^3$ groups. When $R^3$ is H, additives that react with alcohols can effect crosslinking (for example, diepoxides, diisocyanates, or diisothiocyanates). The crosslinking may be initiated thermally, chemically, or photochemically (e.g., by actinic radiation). The actinic radiation may crosslink two $R^3$ groups directly by dimerization or may produce a photoacid or photoradical crosslinking catalyst, for example see U.S. Pat. Nos. 6,555,288 and 6,020,508. Preferably, crosslinking the polymer comprises heating to at least about 200° C.

The fabrication of devices comprising optical waveguides including polymers is well documented, for example see The crosslinked compositions may be used as the clad and/or the core. Preferably, the waveguide core and at least one clad comprise the crosslinked compositions.

Another embodiment is a composition made by a process comprising a) providing a precursor composition comprising a nonlinear optical chromophore having the structure D-π-A and polymer of structure (I)

Figure 3:
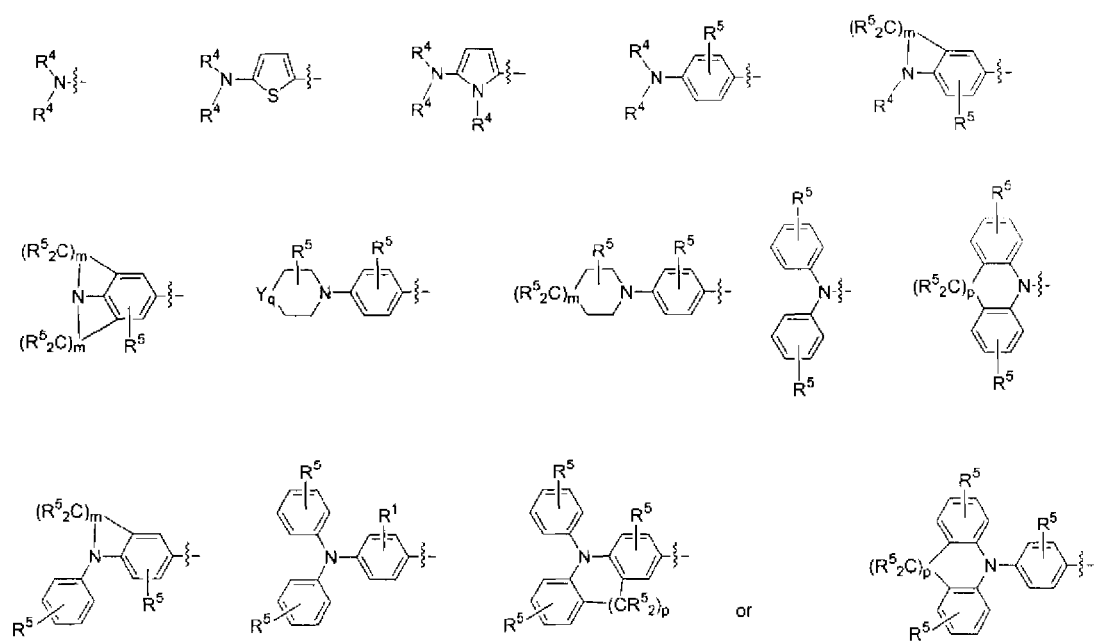
FIG. 3 illustrates exemplary donors for nonlinear optical chromophores.
Figure 4:
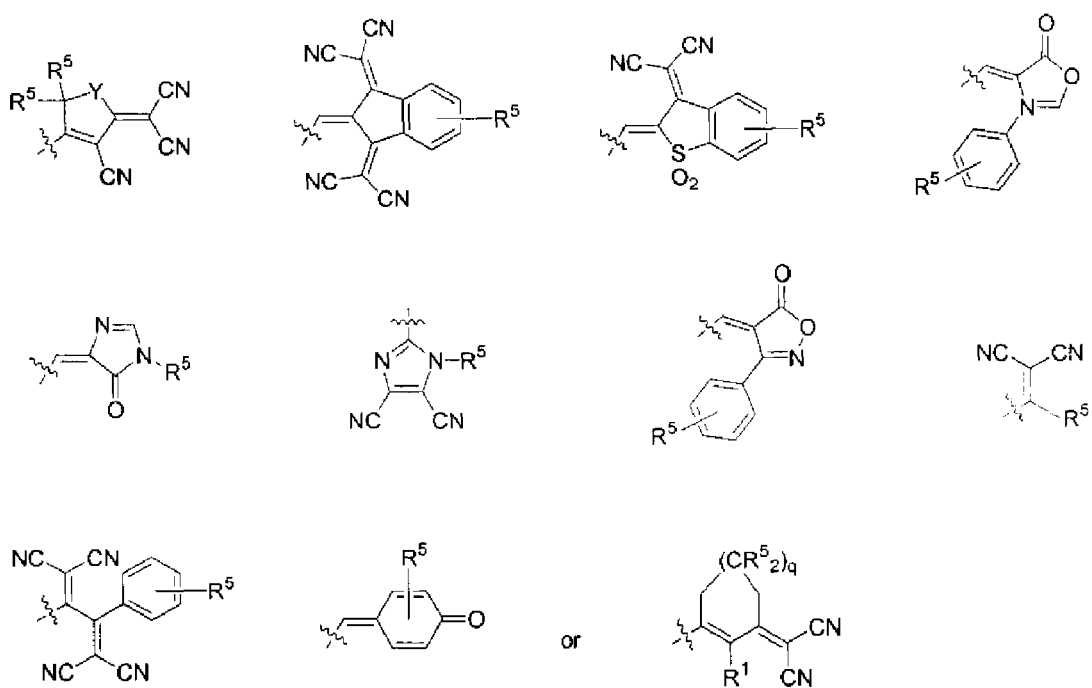
FIG. 4 illustrates exemplary acceptors for nonlinear optical chromophores.

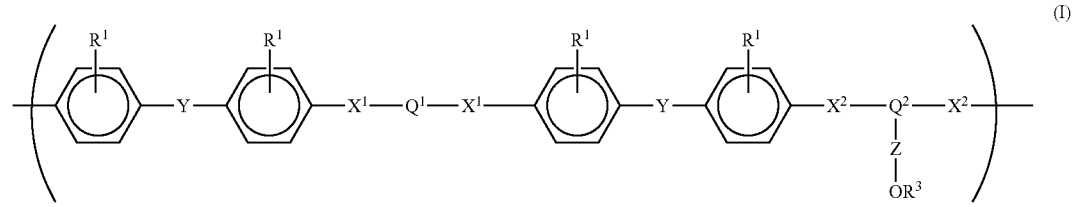

and b) crosslinking the polymer, wherein: D is a donor, π is a p-bridge, A is an acceptor, and $Q^1$, $Q^2$, $X^1$, $X^2$, Z, Y, $R^1$, $R^2$, and $R^3$ are as described above. The precursor composition may be provided by known methods including spin coating, dip coating, brushing, printing (e.g., ink jet printing), and the like. Preferably, the process further comprises applying an electric field to effect poling. Poling induces electro-optic activity in the polymer. The electric field may be applied using contact poling or corona poling. The poling may begin before crosslinking, during crosslinking, or after crosslinking, for example see co-pending, commonly assigned U.S. patent application Ser. No. 10/301,978. The donor moiety D can comprise any of the structures shown in FIG. 3, wherein independently at each occurrence: $R^4$ is H, an alkyl, an aryl, a heteroalkyl group, or a heteroaryl group; $R^5$ is H, a halogen except when bonded to a carbon alpha to or directly to a nitrogen, O, S, an alkyl group, an aryl group, a heteroalkyl group, or a heteroaryl group; Y is O, S or Se; m is 2, 3 or 4; p is 0, 1 or 2; and q is 0 or 1. Acceptor moiety A can comprise any of the structures shown in FIG. 4, wherein independently at each occurrence, $R^5$ is H, a halogen except when bonded to a carbon alpha to or directly to a nitrogen, O, S, an alkyl group, an aryl group, a heteroalkyl group, or a heteroaryl group and Y is O, S or Se. In some embodiments, π comprises a thiophene ring having oxygen atoms bonded directly to the 3 and 4 positions of the thiophene ring. Preferably, the oxygen atoms are independently substituted with an alkyl, heteroalkyl, aryl, or heteroaryl group. An example of a π-bridge comprising a thiophene ring having oxygen atoms bonded directly to the 3 and 4 positions of the thiophene ring is

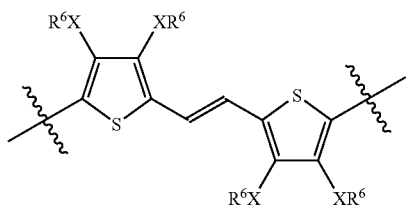

wherein, independently at each occurrence, X is O or S and $R^6$ is an alkyl, aryl, heteroalkyl, or heteroaryl group. Preferably, D is selected from the group consisting of

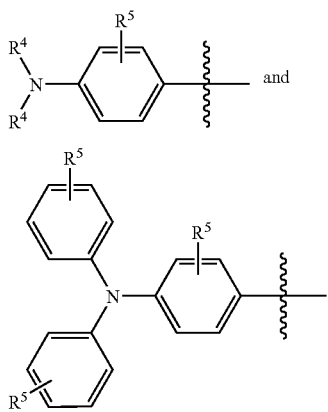

wherein, independently at each occurrence, $R^4$ is H, an alkyl group, an aryl group, a heteroalkyl group, or a heteroaryl group and $R^5$ is H, a halogen except when bonded to a carbon alpha to or directly to a nitrogen, O, S, an alkyl group, an aryl group, a heteroalkyl group, or a heteroaryl group. Preferably, each X is O and each $R^6$ is an alkyl group. In another preferred embodiment, $R^3$ comprises a fluorinated crosslinking group and at least one of $R^4$ or $R^5$ comprises a fluorinated crosslinking group. An example of a suitable fluorinated crosslinking group is

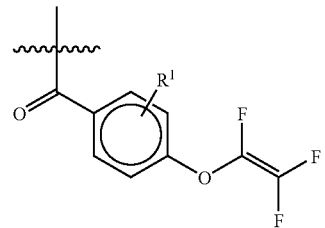

When the crosslinked compositions described above are electro-optic, electro-optic polymer devices comprising the compositions have enhanced properties over conventional electro-optic polymer devices due to an increase in thermal stability from the crosslinking. Thus, another embodiment is an electro-optic device comprising the crosslinked composition described above. The electro-optic device may be an optical modulator, an optical switch, or an optical directional coupler. Preferably, the electro-optic device comprises: 1) an input waveguide; 2) an output waveguide; 3) a first leg having a first end and a second end, the first leg being coupled to the input waveguide at the first end and to the output waveguide at the second end; and 4) a second leg having a first end and a second end, the second leg being coupled to the input waveguide at the first end and to the output waveguide at the second end. Another embodiment is an electro-optic device comprising: 1) an input; 2) an output; 3) a first waveguide extending between the input and output; and 4) a second waveguide aligned to the first waveguide and positioned for evanescent coupling to the first waveguide. Many telecommunication systems can be manufactured from the electro-optic devices described above. The systems can include optical routers and phased array radars. Other embodiments include a method of data transmission comprising transmitting light through the electro-optic composition described above, a method of telecommunication comprising transmitting light through the electro-optic composition described above, a method of transmitting light comprising directing light through or via the electro-optic composition described above, and a method of routing light through an optical system comprising transmitting light through or via the electro-optic composition described above.

Another embodiment is a process comprising a) providing a polymer blend comprising two polymers, wherein at least one polymer is crosslinkable and at least one polymer is luminescent and b) crosslinking the crosslinkable polymer. Both polymers may be crosslinkable. Crosslinkable luminescent polymers are known, for examples see U.S. Pat. No. 5,708,130 and Muller, C. D., et al. Nature 2003, 421 (6925), 829-833. The blend comprising two polymers may be provided by methods including dissolving the two polymers to make a solution and then depositing them by methods known to those skilled in the art like spin-coating, dip-coating, brushing, or printing (e.g., ink-jet printing). In many embodiments, the luminescent polymer comprises a polyfluorene, a polyphenylenevinylene, or a polybiphenyl. Preferably, the luminescent polymer further comprises a charge transporter. The charge transporter may be a hole transporter or an electron transporter. The luminescent polymer may also contain both a hole transporter and an electron transporter. Some exemplary charge transporters are triarylamines, carbazoles, a 2,3-diphenylquinoxalines, and 1,3,4-oxadiazoles. Preferably, the crosslinkable polymer comprises the structure

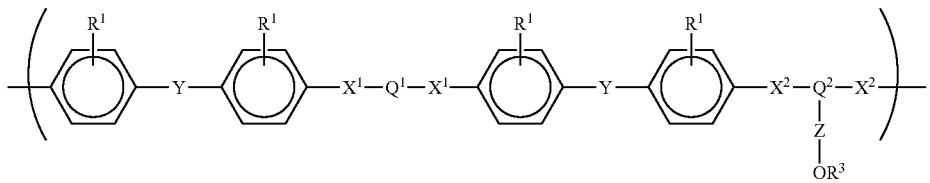

wherein $Q^1$, $Q^2$, $X^1$, $X^2$, Z, Y, $R^1$, $R^2$ and $R^3$ are as described above. Preferably, $R^3$ comprises an aryl trifluorovinyl ether. In many embodiments, the crosslinking is effected thermally, chemically, or photochemically.

Another embodiment is a luminescent composition comprising a polymer blend including a luminescent polymer and a second polymer, wherein at least one polymer is crosslinked. Preferably, the second polymer is crosslinked. In other embodiments, the luminescent polymer is crosslinked or both the luminescent polymer and the second polymer are crosslinked. The luminescent polymer may comprise a polyfluorene, a poly(phenylenevinylene), or a polybiphenyl. Preferably, the polymer that is luminescent further comprises a charge transporter. Examples of charge transporters are triarylamines, a carbazoles, a 2,3-diphenylquinoxalines, a 1,3,4-oxadiazoles.

In many embodiments, the crosslinked polymer comprises units having the formula

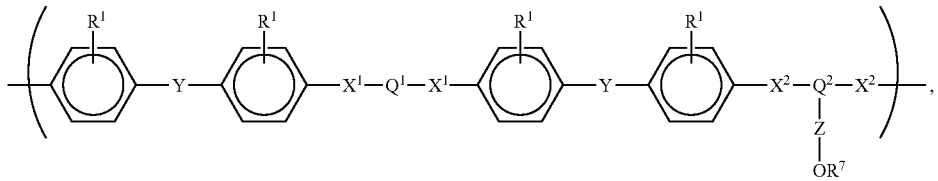

wherein $Q^1$; $Q^2$; $X^1$; $X^2$; Z; Y; $R^1$; and $R^2$ are as defined above and $R^7$ comprises crosslinked group. The crosslinked group $R^7$ is derived from a crosslinking group that has been crosslinked. $R^7$ may be derived from an acrylate, a cinnamate, an aryl trifluorovinyl ether, or a benzocyclobutene. Preferably, $R^7$ is derived from an aryl trifluorovinyl ether. Another embodiment is a device comprising a light emitting element, wherein the light emitting element comprises the luminescent composition described above. The light-emitting element may further comprise a charge injection layer. Charge injection layers typically have energy levels that are between the relevant energy levels of a reference electrode and a luminescent polymer. Preferably, the light emitting element further comprises a hole injection layer. Hole injection layers may comprise poly(3,4-ethylenedioxythiophene), poly(N-vinylcarbazole), polyaniline, or N,N'-diphenyl-N,N'-bis(3-methylphenyl)1,1'-biphenyl-4,4'-diamine. In other embodiments, the light emitting element further comprises an electron injection layer. Electron injection layers may comprise an oxadiazole, a benzobisazole, or a quinoxaline.

The luminescent compositions described above are useful, when crosslinked, in light emitting diodes and provide advantages over noncrosslinked light emitting polymer blends. To fabricate the light emitting diode, a light emitting polymer and a crosslinkable polymer, as described above, can be mixed to the desired ratio in a desired solvent. The solution may be spin coated on a substrate, which usually comprises an electrode. The solvent is evaporated and the films are crosslinked. Other polymers or metal electrodes can be deposited on the crosslinked films. Devices comprising the composition described above show enhanced performance over typical polymer light emitting diodes. Thus, another embodiment is a device comprising a light emitting element, wherein the light emitting element comprises the polymer blend described above. The light emitting element may further comprises a hole injection layer. Exemplary hole injection layers include those comprising poly(3,4-ethylenedioxythiophene), poly(N-vinylcarbazole), polyaniline, or N,N'-diphenyl-N,N'-bis(3-methylphenyl)1,1'-biphenyl-4,4'-diamine. In other embodiments, the light emitting element further comprises an electron injection layer. Exemplary electron injection layers include those that comprise an oxadiazole, a benzobisazole, or a quinoxaline.

EXAMPLES

The following example(s) is illustrative and does not limit the Claims.

Example 1

Figure 5:
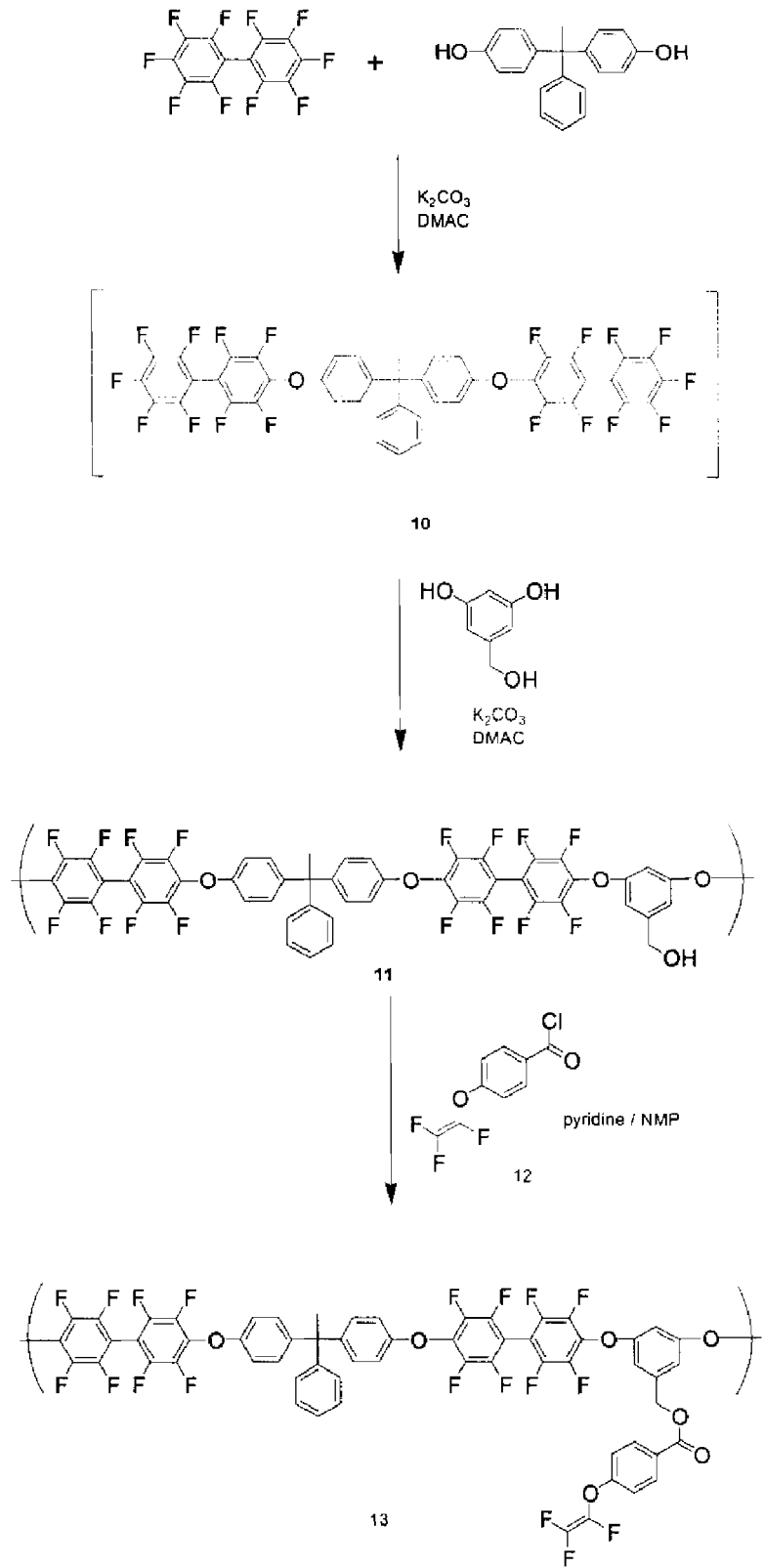
FIG. 5-6 outline the synthesis of a crosslinkable poly (arylene ether).

Referring to FIG. 5, Decafluorobiphenyl (100 g, 0.3 mole), 4,4'-(1-phenylethylidene)bisphenol (43.55 g, 0.15 mole) and 26 g of $K_2CO_3$ were added to a 1 L round bottom flask, followed by 400 mL of N,N-dimethylacetamide (99.9%, anhydrous). The bath temperature was ramped from room temperature to 120° C. in 1 hour. The reaction was stirred at 120° C. for 20 h. The temperature was cooled to 105° C. over 1 h to provide 10, at which point 3,5-dihydroxybenzylalcohol (21.02 g, 0.15 mole) was added along with 20 g of $K_2CO_3$. Over the course of 3 h, the bath temperature was ramped up to 115° C. and the flask contents allowed to react for one additional hour at 115° C. The reaction mixture was then removed from the heat and filtered through a frit while still hot. 50 mL of THF was used to wash remaining polymer through the frit. The solution was cooled to room temperature, and transferred to a dropping funnel. The solution was added dropwise to a mixture of 750 mL methanol-200 mL DI $H_2O$ in a blender. The solid was collected on a frit, and dried in the air overnight. The solid was then taken up in 250 mL of THF, forming a viscous solution. It was transferred to a dropping funnel and added dropwise to a solution of 500 ml methanol-200 ml DI $H_2O$. The solid was collected and air-dried on the frit for at least 5 hours. The solid was then heated at 80° C. at 87 torr on a rotary evaporator for 5 hours. The product 11, a fine white powder, was isolated in 30% yield (114 g).

Referring to FIG. 5, 350 mL of anhydrous N-methylpyrrolidone was transferred into a 1 L one neck round bottom flask containing 11 (44.3 g). Drisolv grade pyridine (100 mL) was added. The mixture was stirred at room temperature for one hour, then 20.0 g (0.085 mole) of 4-trifluorovinyloxybenzoyl chloride, 12, was added to the solution. The solution was stirred, under a nitrogen purge, for 20 h. The color of the solution changed from light yellow to brown. The reaction was dropped slowly into a solution of methanol (500 ml) and deionized water (200 ml) in a blender. The precipitate was filtered on a glass fritted funnel (coarse). Under the given dilutions, there was a reasonable amount of emulsified polymer in the filtrate, showing some amount of fractionation. The collected solid was washed with methanol (~2 L), which further removed some of the existing yellow color. The resulting solid was dried on the frit in air for 48 h. The solid was then transferred to a 1 L beaker, and 250 mL of THF was added. Once the polymer dissolved (~30 min), it was transferred to a dropping funnel. It was added dropwise to a solution of methanol (750 mL) and water (200 mL) in a blender. Solid was collected on the frit, washed with additional methanol (~2 L) and air dried on the frit (with vacuum) for ~4 h. The solid was again dissolved in 250 mL of THF, and dropped into 750 mlMeOH/200 ml DI water while stirring in a blender. The solid was collected and dried overnight. Finally, the solid was taken up in 250 ml of THF and dropped into 700 ml MeOH/250 ml DI water. The solid was placed in a 1 L round bottom flask, and placed on a rotary evaporator (60° C., 10 Torr) for 4 h to give 40.0 g of 13 as a white powder.

Figure 6:
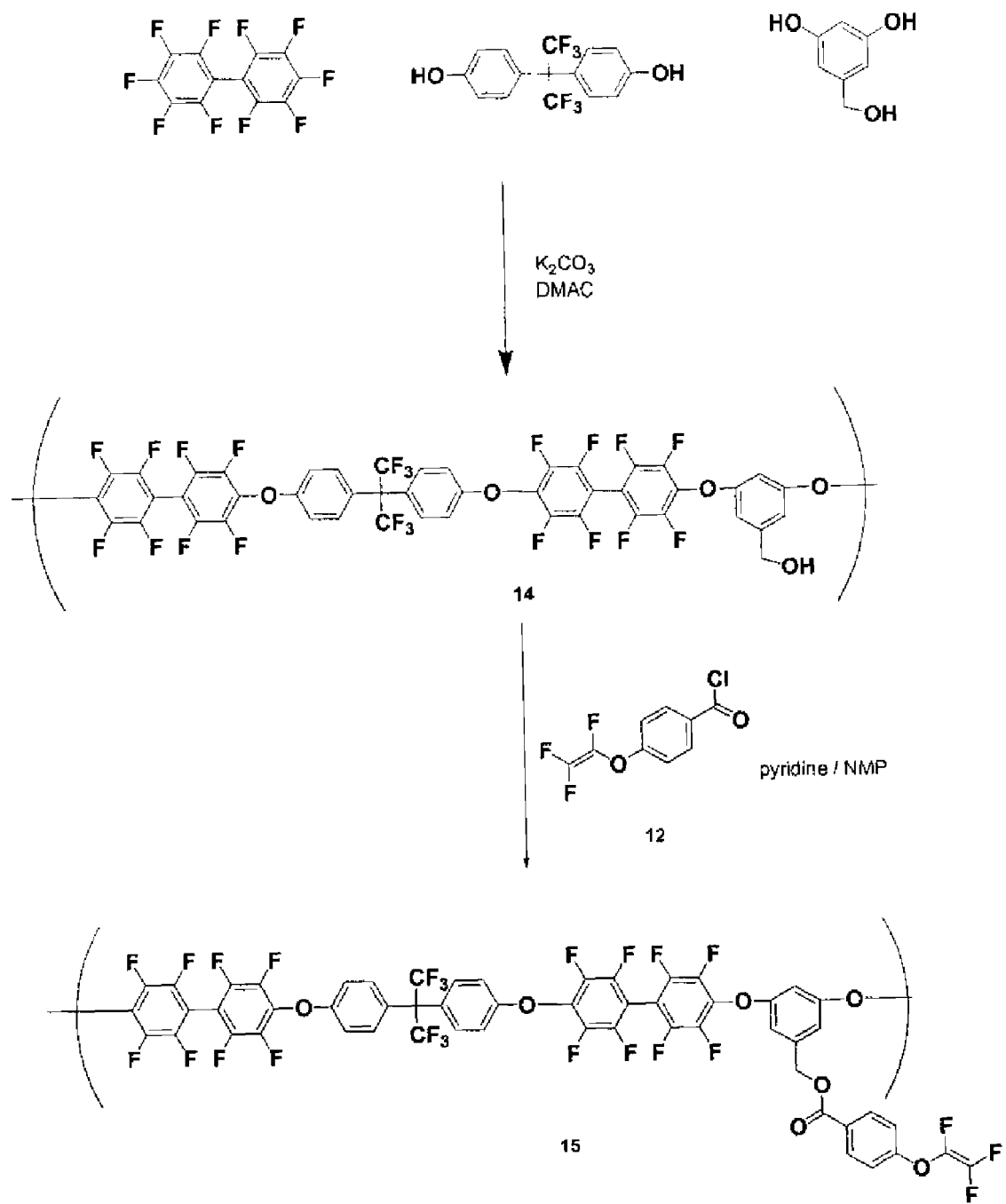

Referring to FIG. 6, decafluorobiphenyl (56.12 g, 0.168), 2,2'-bis(4-hydroxyphenyl)hexafluoropropane (28.25 g, 0.084 mole), and 3,5-dihydroxybenzylalcohol (11.77 g, 0.084 mole) were added to a 500 mL round bottom flask, followed by 250 mL of N,N-dimethylacetamide (99.9%, anhydrous). The mixture was stirred at room temperature for 45 min in so that all of the components were completely dissolved. Next, potassium carbonate (51.14 g, 0.37 mole) was added and the flask placed into a preset 50° C. oil bath for 45 minutes. Afterwards, the flask was moved into a preset 100° C. bath, while stirring and keeping the temperature constant for 65 min. The reaction mixture was then removed from the heat and filtered through a frit while still hot. The solution was cooled to room temperature, and transferred to a dropping funnel. The solution was added dropwise to a mixture of 400 mL methanol-100 mL DI $H_2O$ in a blender. The solid was collected on a frit, and dried in the air overnight. The solid was taken up in 250 mL of THF, forming a viscous solution. It was then transferred to a dropping funnel and added dropwise to a solution of 400 ml methanol-100 ml DI $H_2O$. The solid was collected and air-dried on the frit overnight. The solid was heated at 80° C. at 80 torr on a rotary evaporator for 5 hours. The product 14, a white powder, was isolated in 40% yield (42 g).

Referring to FIG. 6, 20 mL of anhydrous N-methylpyrrolidone was transferred into a 100 ml one-neck round bottom flask containing 14 (10 g). Drisolv grade pyridine (3 mL) was added. The mixture was stirred at room temperature for one hour at which point the entire solid was dissolved. 8.0 ml of 4-trifluorovinyloxybenzoyl chloride, 12, was added to the solution. The solution was stirred, under a nitrogen purge, for 43 h. The color of the solution changed from light yellow to brown. The reaction mixture (viscous solution) was transferred to a dropping funnel. The solution was added dropwise to a solution of 75 ml MeOH/25 ml $H_2O$. The solid was collected on a frit, and air-dried. The solid was taken up in 25 ml of THF, and added dropwise to a solution of 75 ml MeOH/25 ml $H_2O$. The product 15 was collected, and the precipitation was repeated one additional time, yielding 5.2 g of solid.

Example 2

In this example, a film of polymer 13 was provided and crosslinked. A solution of about 30% by wt. of polymer 13 in cyclopentanone was filtered through a 0.2 μm nylon filter and spin coated on a 6-inch silicon wafer having a 15 μm $SiO_x$ surface. The polymer was baked at 150° C. under $N_2$ to help remove the solvent. The thickness of the resulting film was 4.0 μm. The film was then heated at 220° C. for 30 min under $N_2$ and cooled to room temperature. The average optical loss of five measured points was 0.77 dB/cm. The film was resistant to a variety of solvents.

Example 3

Figure 7:
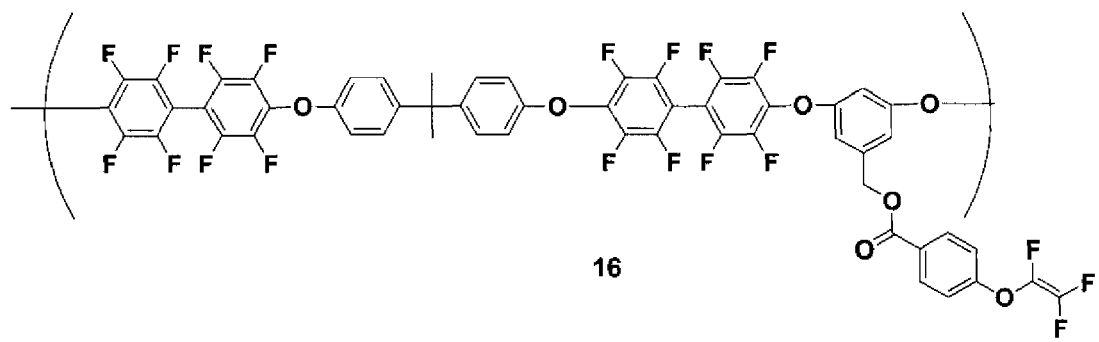
FIG. 7 illustrates useful polymers and chromophores.
Figure 7:
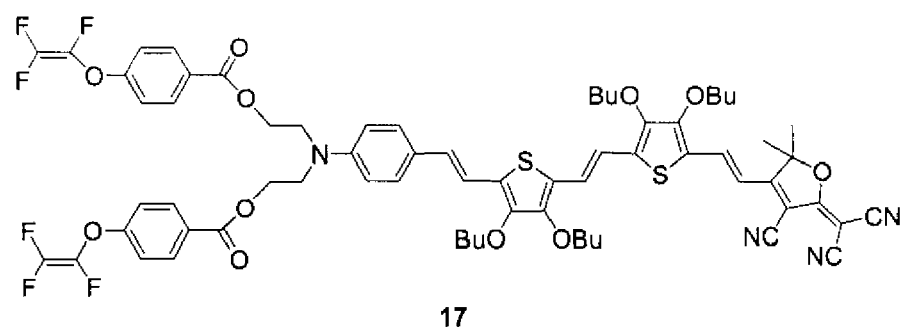
Figure 7:
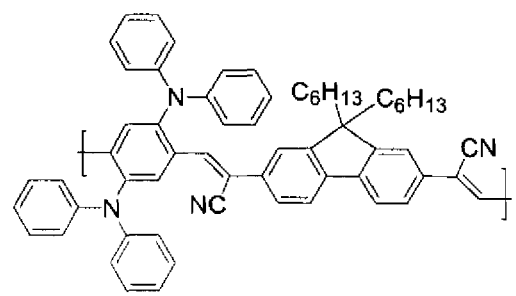

In this example, a film of polymer 16 (FIG. 7) was provided and crosslinked. Polymer 16 was prepared in a similar manner as polymer 13, except bisphenol A was used in place of 4,4'-(1-phenylethylidene)bisphenol). A solution of about 30% by wt. of polymer 16 in cyclopentanone was filtered through a 0.2 μm nylon filter and spin coated on a 6-inch silicon wafer having a 15 μm $SiO_x$ surface. The polymer was baked at 150° C. under $N_2$ to help remove the solvent. The thickness of the resulting film was 2.9 μm. The film was then heated at 220° C. for 30 min under $N_2$ and cooled to room temperature. The average optical loss of five measured points was 0.62 dB/cm. The film was resistant to a variety of solvents.

Example 4

In this example, a polymer film of a nonlinear optical D-π-A chromophore and polymer 13 was provided and poled. Compound 17 (FIG. 7) was the nonlinear optical chromophore, and was prepared as described in copending, commonly assigned U.S. patent application Ser. No. 10/301,978. A 30% by wt. solution of 17 and polymer 13 in cyclopentanone was spin coated on 2" glass wafers coated with indium tin oxide (ITO) (~30% by wt. solution of total solids with respect to cyclopentanone; the chromophore was loaded at 15% by wt. with respect to the polymer). The wafer was soft baked at 100° C. under $N_2$ to help remove the remaining solvent from the film. A corona voltage of 5 kV was applied to the film while it was heated to 220° C. over 10 min (t=0). The film was maintained at 220° C. for 40 min while the voltage was increased to 5.5 kV, 6.5 kV, and 7.5 kV at t=15 min, t=23 min, and t=30 min, respectively. At t=40 min the wafer was brought to room temperature over about 10 min under the 7.5 kV field. The $r_{33}$ of the film was 24 pm/V (measured at 1310 nm by the Teng-Man method).

Example 5

In this example, a composition comprising a light-emitting polymer (LEP) and a crosslinkable polymer is provided. The light-emitting polymer used was ADS111RE from American Dye Source (polymer 18, FIG. 7). A 3% total solids by wt. solution of polymer 18 and polymer 13 in cyclopentanone was spin coated on a 2" glass wafer covered with ITO (the ratio of polymer 18 to the polymer 13 was 50/50 (wt./wt.)). The film was heated at 150° C., and then heated at 220° C. under $N_2$. The resulting crosslinked blend film thickness was 100 nm and was solvent resistant. In order to complete the fabrication of the polymer light emitting diode (50/50 LEP Blend), an aluminum electrode was e-beam evaporated onto the polymer.

Figure 8:
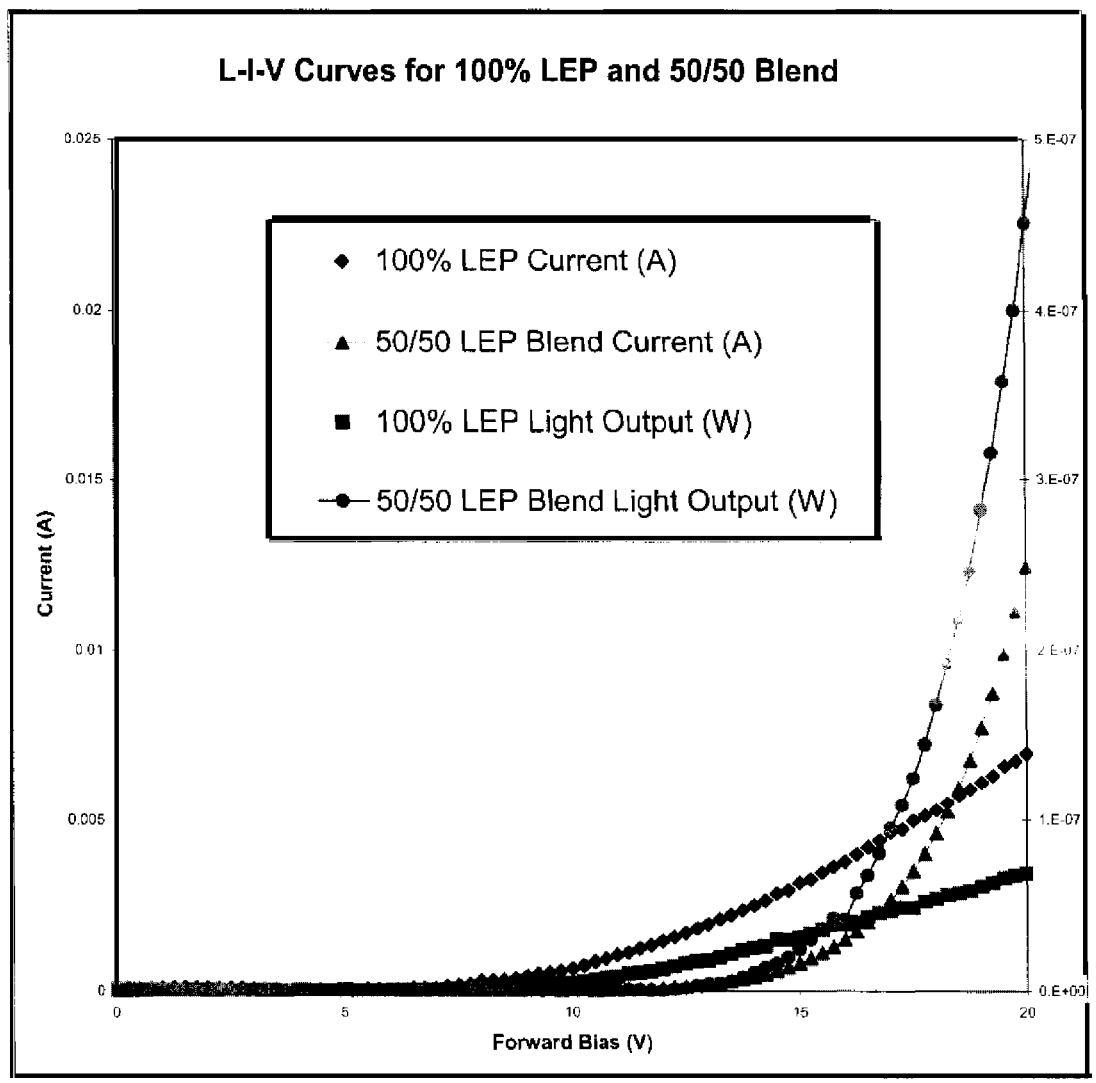
FIG. 8 is a graph comparing electroluminescent performance.

For the purpose of comparison, an light emitting device (100% LEP) was fabricated using only polymer 18. The light-current-voltage (L-I-V) curves for the 50/50 LEP Blend device and 100% LEP device are plotted on the same scale in FIG. 8. The aluminum electrode was biased as the electron source and the ITO acts as the hole source. A definite increase in luminance and current is observed for 50/50 LEP Blend device over the 100% LEP device for most of the operating range.

A number of embodiments of the invention have been described. Nevertheless, it will be understood that various modifications may be made without departing from the spirit and scope of the invention. Accordingly, other embodiments are within the scope of the following claims.

What is claimed is:

1. An electro-optic device comprising a composition made by a process comprising: a) providing precursor composition comprising a nonlinear optical chromophore having the structure D-π-A and a polymer comprising units having the formula

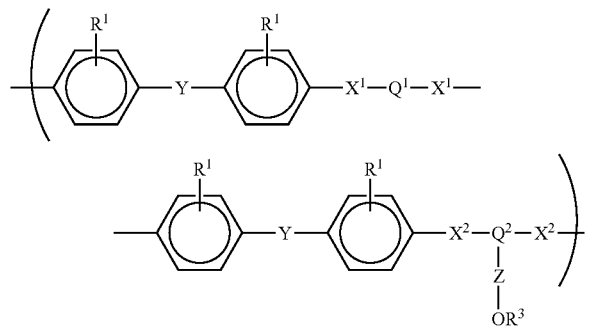

and b) crosslinking the polymer, wherein:
D is a donor;
π is a π-bridge;
A is an acceptor;
$Q^1$ comprises at least one aryl or heteroaryl group;
$Q^2$ comprises at least one aryl or heteroaryl group;
$X^1$ is O bonded directly to an aryl carbon of $Q^1$;
$X^2$ is O bonded directly to an aryl carbon of $Q^2$;
Z is a linker comprising at least one —$(C(R^2)_2)$— group;
Y is a single bond or a linker group;
$R^1$ is independently at each occurrence H, a halogen, an alkyl group, a heteroalkyl group, an aryl group, or a heteroaryl group;
$R^2$ is independently at each occurrence H, an alkyl group, or a heteroalkyl group; and
$R^3$ is H or a crosslinkable group.

2. The electro-optic device of claim 1, wherein the electro-optic device is selected from the group consisting of an optical modulator, an optical switch, and an optical directional coupler.

3. The electro-optic device of claim 1, comprising: 1) an input waveguide; 2) an output waveguide; 3) a first leg having a first end and a second end, the first leg being coupled to the input waveguide at the first end and to the output waveguide at the second end; and 4) and a second leg having a first end and a second end, the second leg being coupled to the input waveguide at the first end and to the output waveguide at the second end.

4. The electro-optic device of claim 1, comprising: 1) an input; 2) an output; 3) a first waveguide extending between the input and output; and 4) a second waveguide aligned to the first waveguide and positioned for evanescent coupling to the first waveguide.

5. An optical router including the electro-optic device of claim 1.

6. A communications system including at least one electro-optic device of claim 1.

7. A method of data transmission comprising transmitting light through the electro-optic device of claim 1.

8. A method of telecommunication comprising transmitting light through the the electro-optic device of claim 1.

9. A method of transmitting light comprising directing light through or via the the electro-optic device of claim 1.

10. A method of routing light through an optical system comprising transmitting light through or via the electro-optic device of claim 1.

* * * * *